US009263290B2

(12) United States Patent
Bergendahl et al.

(10) Patent No.: US 9,263,290 B2
(45) Date of Patent: Feb. 16, 2016

(54) SUB-LITHOGRAPHIC SEMICONDUCTOR STRUCTURES WITH NON-CONSTANT PITCH

(71) Applicant: GLOBALFOUNDRIES Inc., George Town (KY)

(72) Inventors: Marc A. Bergendahl, Troy, NY (US); David V. Horak, Essex Junction, VT (US); Charles W. Koburger, III, Enfield, NH (US); Shom Ponoth, Irvine, CA (US); Chih-Chao Yang, Glenmont, NY (US)

(73) Assignee: GLOBALFOUNDRIES INC., George Town (KY)

( * ) Notice: Subject to any disclaimer, the term of this patent is extended or adjusted under 35 U.S.C. 154(b) by 0 days.

(21) Appl. No.: 14/843,085

(22) Filed: Sep. 2, 2015

(65) Prior Publication Data

US 2015/0380262 A1    Dec. 31, 2015

Related U.S. Application Data

(62) Division of application No. 13/659,318, filed on Oct. 24, 2012, now Pat. No. 9,177,820.

(51) Int. Cl.
*H01L 21/311* (2006.01)
*H01L 21/308* (2006.01)
*H01L 21/3065* (2006.01)

(52) U.S. Cl.
CPC ........ *H01L 21/3088* (2013.01); *H01L 21/3065* (2013.01); *H01L 21/3085* (2013.01); *H01L 21/3086* (2013.01)

(58) Field of Classification Search
USPC ......... 438/694, 703, 689, 151, 197, 696, 700, 438/149, 199, 219, 220, 268, 295, 585, 587, 438/596, 679, 695, 702, 20, 785, 289, 479; 257/E21.214, E29.002, 506, E21.09, 257/E21.631, E27.061, 347, 392
See application file for complete search history.

(56) References Cited

U.S. PATENT DOCUMENTS

| 6,444,512 B1 * | 9/2002 | Madhukar ....... H01L 21/823842 257/E21.444 |
| 6,875,703 B1 | 4/2005 | Furukawa et al. |
| 7,531,456 B2 | 5/2009 | Kwon et al. |

(Continued)

OTHER PUBLICATIONS

Hwang et al. "A Middle-1X nm NAND Flash Memory Cell (M1X-NAND) with Highly Manufacturable Integration Technologies", 2011 IEEE, Flash Device Development & Advanced Process Team, R&D Division, Hynix Semiconductor Inc., Korea, 4 pages.

(Continued)

*Primary Examiner* — Telly Green
(74) *Attorney, Agent, or Firm* — Yuanmin Cai; Andrew M. Calderon; Roberts Mlotkowski Safran & Cole, P.C.

(57) ABSTRACT

Fin structures and methods of manufacturing fin structures using a dual-material sidewall image transfer mask to enable patterning of sub-lithographic features is disclosed. The method of forming a plurality of fins includes forming a first set of fins having a first pitch. The method further includes forming an adjacent fin to the first set of fins. The adjacent fin and a nearest fin of the first set of fins have a second pitch larger than the first pitch. The first set of fins and the adjacent fin are sub-lithographic features formed using a sidewall image transfer process.

7 Claims, 9 Drawing Sheets

(56) References Cited

U.S. PATENT DOCUMENTS

| | | | |
|---|---|---|---|
| 7,615,496 B2 | 11/2009 | Lee et al. | |
| 7,807,525 B2* | 10/2010 | Doris | H01L 21/823807 257/E27.062 |
| 7,808,053 B2 | 10/2010 | Haller et al. | |
| 7,829,466 B2* | 11/2010 | Johnson | H01L 21/823431 438/197 |
| 7,879,669 B1* | 2/2011 | Teng | H01L 21/823807 257/262 |
| 7,923,337 B2* | 4/2011 | Chang | H01L 29/66545 257/346 |
| 7,972,959 B2 | 7/2011 | Mebarki et al. | |
| 8,026,044 B2 | 9/2011 | Lee et al. | |
| 8,026,179 B2 | 9/2011 | Lue | |
| 8,027,179 B2 | 9/2011 | Hallak | |
| 8,669,167 B1* | 3/2014 | Chang | H01L 27/1211 257/347 |
| 2002/0074612 A1* | 6/2002 | Bulucea | H01L 21/26586 257/402 |
| 2005/0019993 A1* | 1/2005 | Lee | H01L 21/84 438/157 |
| 2005/0051812 A1* | 3/2005 | Dixit | H01L 29/1041 257/250 |
| 2007/0052037 A1* | 3/2007 | Luan | H01L 21/823821 257/369 |
| 2007/0075351 A1* | 4/2007 | Schulz | H01L 21/823821 257/314 |
| 2007/0196961 A1* | 8/2007 | Vitale | H01L 21/28123 438/147 |
| 2007/0292996 A1* | 12/2007 | Abadeer | B07C 5/344 438/165 |
| 2008/0081461 A1 | 4/2008 | Lee et al. | |
| 2008/0093699 A1* | 4/2008 | Abe | H01L 21/2652 257/499 |
| 2009/0084181 A1* | 4/2009 | Kolb | G01C 19/56 73/514.16 |
| 2009/0309167 A1* | 12/2009 | Russ | H01L 21/8249 257/370 |
| 2010/0167548 A1 | 7/2010 | Kim | |
| 2010/0197096 A1* | 8/2010 | Johnson | H01L 21/823431 438/268 |
| 2011/0014791 A1* | 1/2011 | Johnson | H01L 21/823431 438/696 |
| 2011/0053361 A1* | 3/2011 | Muralidhar | H01L 21/3086 438/585 |
| 2011/0111596 A1* | 5/2011 | Kanakasabapathy | H01L 21/0337 438/694 |
| 2011/0298018 A1* | 12/2011 | Yin | H01L 21/28105 257/288 |
| 2012/0086078 A1 | 4/2012 | Anderson et al. | |
| 2012/0128935 A1 | 5/2012 | Dunn et al. | |
| 2013/0134486 A1* | 5/2013 | LiCausi | H01L 21/28132 257/288 |
| 2014/0065802 A1* | 3/2014 | Chang | H01L 21/845 438/479 |

OTHER PUBLICATIONS

C. Bencher "An Assessment of Patterning Options for 15nm Half-Pitch", 2011 IEEE, Applied Materials Inc., CA, 2 pages.

Zhang et al. "Characterization and Decomposition of Self-Aligned Quadruple Patterning Friendly Layout", Proc. of SPIE vol. 8326, downloaded from SPIE Digital Library on Apr. 4, 2012, 11 pages.

* cited by examiner

SUB-LITHOGRAPHIC SEMICONDUCTOR STRUCTURES WITH NON-CONSTANT PITCH

FIELD OF THE INVENTION

The invention relates to semiconductor structures and, more particularly, to fin structures and methods of manufacturing fin structures using a dual-material sidewall image transfer mask to enable patterning of sub-lithographic features.

BACKGROUND

As critical dimensions in integrated circuit fabrication descend below widths printable employing deep ultraviolet (DUV) lithography processing, fabrication processes are turning to Sidewall Image Transfer (SIT) techniques. The SIT techniques provide a way to build structures having pitch and width which are not otherwise possible with conventional DUV lithography processes. The SIT process can be used to manufacture, for example, fin structures, e.g., FinFETs, with a constant pitch and width.

SUMMARY

In one or more embodiments of the invention, a method of forming a plurality of fins comprises forming a first set of fins having a first pitch. The method further comprises forming an adjacent fin to the first set of fins. The adjacent fin and a nearest fin of the first set of fins have a second pitch larger than the first pitch. The first set of fins and the adjacent fin are sub-lithographic features formed using a sidewall image transfer process.

In one or more embodiments of the invention, a method comprises forming an etch stop layer on a semiconductor material and forming a mandrel on the etch stop layer. The method further comprises forming sidewall spacer material on the mandrel and removing the mandrel. The method further comprises forming filler spacers on the sidewall spacer material. The method further comprises forming fill material between the filler spacers. The method further comprises removing the filler spacers and portions of the semiconductor material below the filler spacers to form: a first set of structures comprising the sidewall spacers, the etch stop layer and the semiconductor material, and a second set of structures comprising the fill material and the semiconductor material. The method further comprises alternately forming a mask over groupings of a plurality of the first set of structures and the second set of structures, and alternating etching material from unprotected ones of the first set of structures and the second set of structures to form fin structures of the semiconductor material with a non-constant pitch.

In one or more embodiments of the invention, a structure comprises a first set of fins having a first pitch and an adjacent fin to the first set of fins. The adjacent fin and a nearest fin of the first set of fins have a second pitch larger than the first pitch. The first set of fins and the adjacent fin are sub-lithographic features formed from semiconductor material on an oxide layer.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the fin structures, which comprises the structures of the present invention. In still further embodiments, a method in a computer-aided design system is provided for generating a functional design model of the fin structures. The method comprises generating a functional representation of the structural elements of the fin structures.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to fin structures and methods of manufacturing such fin structures. In embodiments, the fin structures can be fabricated using a dual-material sidewall image transfer (SIT) mask to enable patterning of sub-lithographic features. More specifically, the present invention uses a SIT-squared technique or variation thereof to pattern sub-lithographic features using 1× lithography processes. A SIT-squared technique uses two sets of feature-defining spacers, which enable 4× pitch reduction, e.g., fins can obtain dimensions of about 6-8 nm width and space. Advantageously, the present invention enables the patterning of sub-lithographic fins with a non-constant pitch or substantially constant pitch depending on mandrel and conformal coating implemented with the present invention, while providing improved fin-to-fin width control.

In more specific embodiments, an etch stop layer (e.g., $HfO_2$ or $SiO_2$) is provided on a substrate (e.g., SOI layer). Mandrels are formed on the etch stop layer, which comprise material, e.g., $Si_3N_4$ or $SiO_2$, that can be selectively etched to the etch stop layer. Sidewall spacers are formed on the mandrels, which can be for example, amorphous silicon (aSi). The mandrels are stripped to expose the etch stop layer, and leaving the sidewall spacers. Filler spacers (e.g., $SiO_2$) are formed on both sides of the sidewall spacers, and fill material is deposited between the filler spacers. The fill material is of a different material than the filler spacers, e.g., $Si_3N_4$. The filler spacers can then be removed, in addition to the etch stop layer and the SOI layer which was previously protected by the filler spacers. Thereafter, through selective masking operations, sub-lithographic fins of different spacing or pitch can be formed on the substrate.

Figure 1:
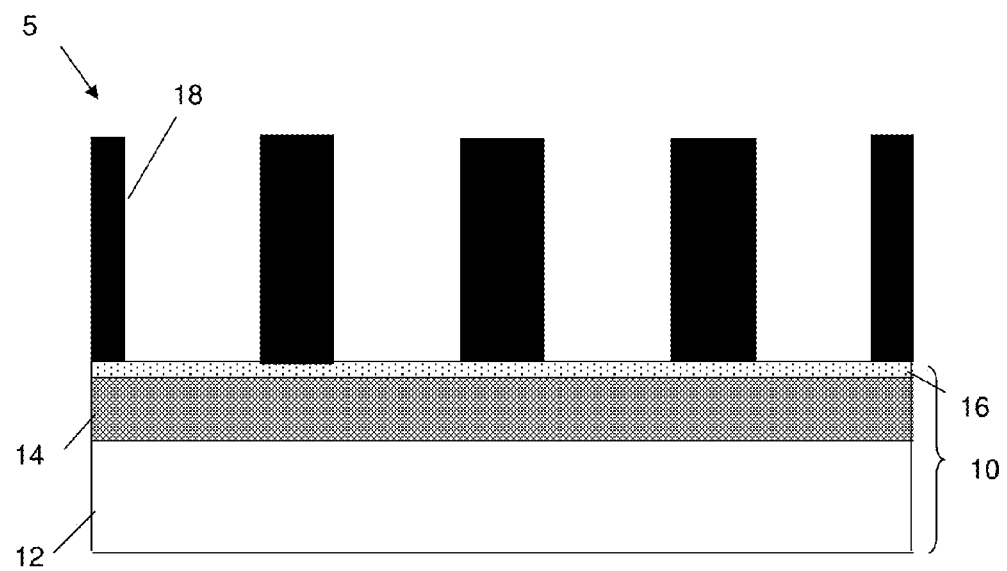
FIGS. 1-9 show processing steps and respective structures in accordance with aspects of the present invention.

FIG. 1 shows a structure and respective processing steps in accordance with aspects of the present invention. In embodiments, the structure 5 includes a substrate 10. In embodiments, the substrate 10 is a silicon on insulator (SOI) formed using conventional processes such as wafer bonding or SiMOX. In embodiments, the substrate 10 includes a BOX layer 12. It should be understood by those of skill in the art that the BOX layer 12 can be provided on an underlying substrate, e.g., silicon, and is formed of an oxide based material. A silicon based layer 14 is formed on the BOX layer 12. In embodiments, the layer 14 can be, for example, Silicon or SiGe or other known semiconductor materials. An etch stop layer 16 is deposited on the layer 14. In embodiments, the etch stop layer 16 can be $HFO_2$ or $SiO_2$.

A mandrel 18 is formed on the etch stop layer 16, using conventional deposition, lithography and etching processes. For example, a mandrel material, e.g., $Si_3N_4$ or $SiO_2$, is deposited on the etch stop layer 16 using conventional chemical vapor deposition (CVD) processes. A resist is formed on the mandrel material, and exposed to light to form a pattern (openings). A reactive ion etching is performed through the openings to form the mandrels 18. In embodiments, the mandrels 18 can have a width of about 22 nm, and a spacing of about 34 nm (pitch of about 56 nm); although other dimensions are also contemplated by the present invention.

Figure 2:
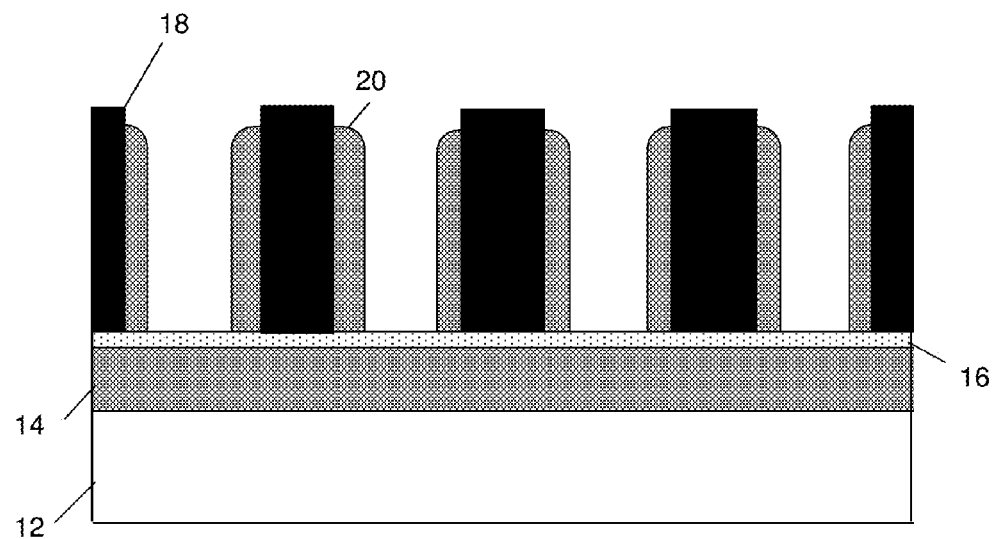

In FIG. 2, sidewall spacers 20 are formed on the sides of the mandrels 18. In embodiments, the sidewall spacers 20 are amorphous silicon (or other material that is different than the mandrels 18 and other subsequently formed structures as discussed below, in order to allow selective etching). In embodiments, the sidewall spacers 20 can be formed by using conventional deposition processes known to those of skill in the art. The sidewall spacers 20 can have a width of about 6 nm; although, other dimensions are also contemplated by the present invention.

Figure 3:
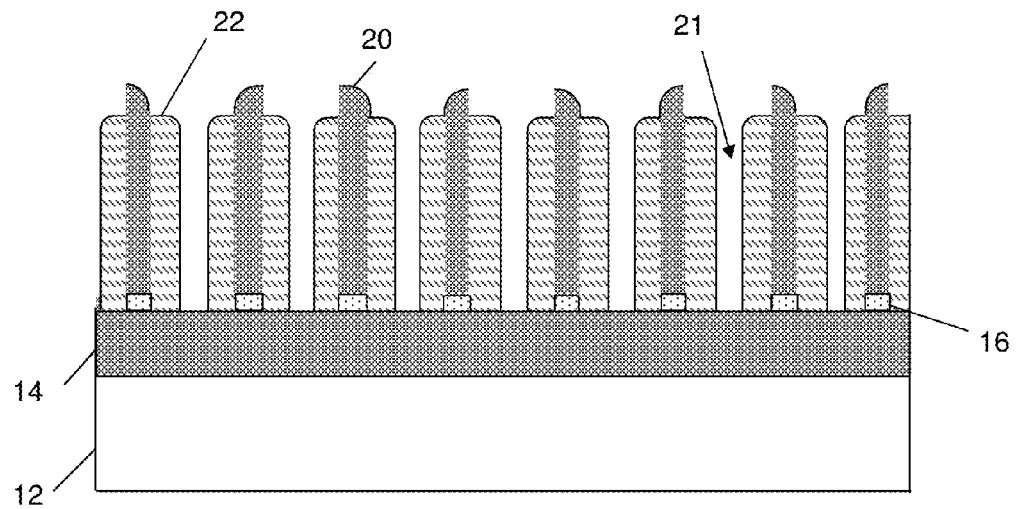

As shown in FIG. 3, the mandrels are removed or stripped using a conventional etching process, selective to the mandrel material. In embodiments, the etch stop layer underlying the mandrels is also removed, using a selective pull down or etching process. Filler spacers 22 are formed on the sidewalls of the sidewall spacers 20, extending directly on to the surface of the layer 14. The filler spacers 22 are formed using a conventional conformal deposition process. In embodiments, the filler spacers 22 are $SiO_2$ or other material that is different than the material forming the sidewall spacers 20. In embodiments, the filler spacers 22 can be formed to a width of about 8 nm, leaving a space 21 therebetween of about 6 nm; although other dimensions are also contemplated by the present invention.

Figure 4:
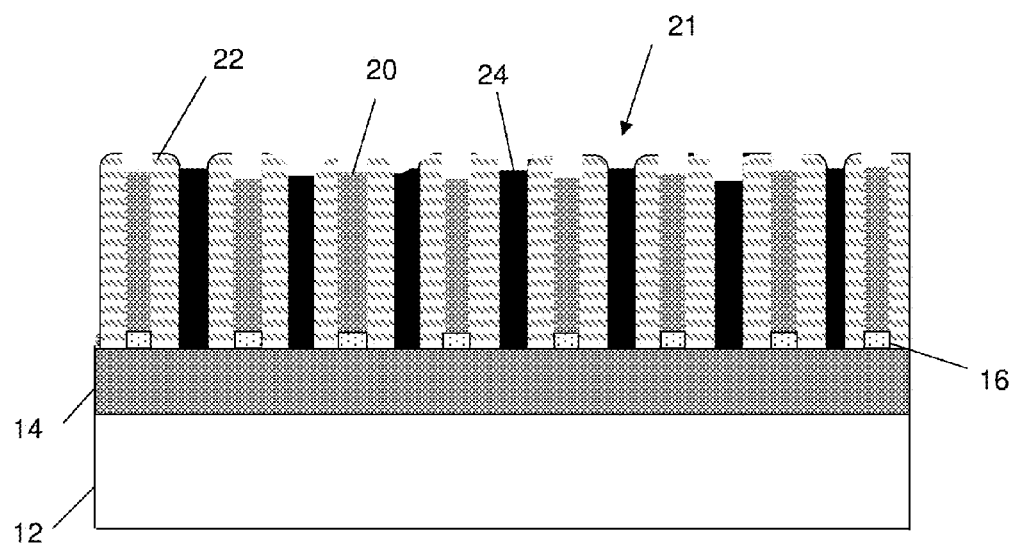

In FIG. 4, the space 21 is filled with fill material 24. In embodiments, the fill material 24 is $Si_3N_4$, or other material that is different than the material forming the sidewall spacers 20 and the filler spacers 22. The fill material 24 can be deposited using a conventional conformal deposition process, for example. Any fill material 24 that was deposited on top of the sidewall spacers 20 and the filler spacers 22 can be removed using, for example, a conventional etching process. In embodiments, the sidewall spacers 20 can also be pulled down to maintain control of the aspect ratio.

Figure 5:
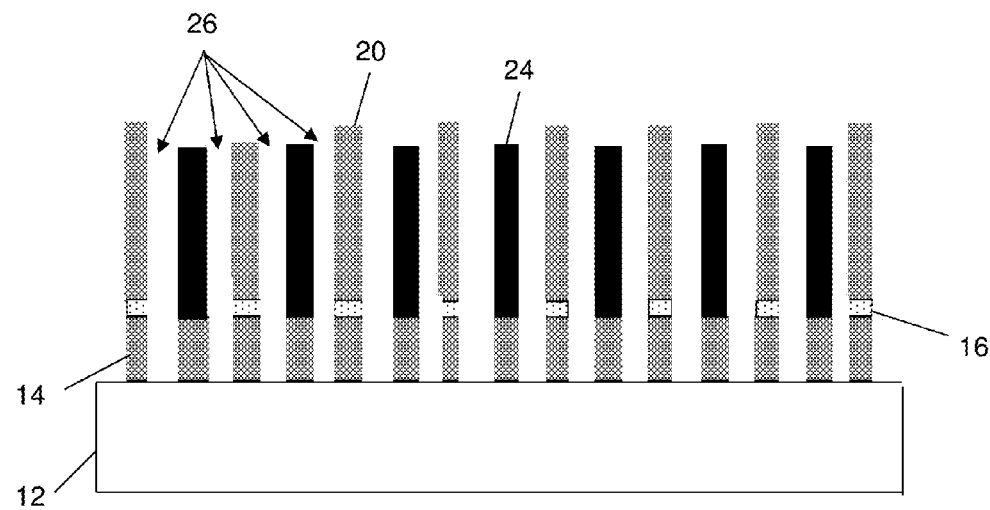

As shown in FIG. 5, the filler spacers are removed using a selective etching process. For example, in embodiments, the selective etching process is selective to the material of the filler spacers, e.g., $SiO_2$. That is, the etchant chemistry will not remove the sidewall spacers 20 or the fill material 24. This being the case, the sidewall spacers 20 will protect the underlying etch stop layer 16, which will be utilized in later selective etching processes. In further embodiments, the exposed portions of the layer 14 are removed. In this process, the BOX 12 will act as a stop layer, as the etchant chemistry is selective to the material of layer 14. This process forms a space 26 between the remaining structures.

Figure 6:
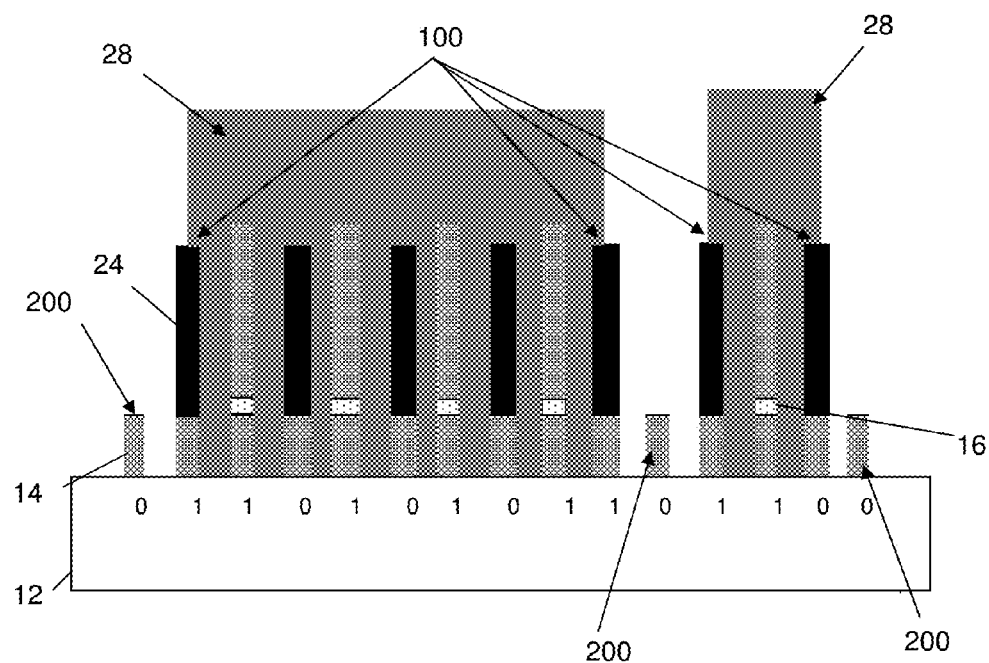

FIG. 6 shows additional processes and a respective structure in accordance with aspects of the present invention. In FIG. 6, the structures thus formed are provided at spaces labeled sequentially: 0, 1, 1, 0, 1, 0, 1, 0, 1, 1, 0, 1, 1, 0, 0. As shown in FIG. 6, a mask 28 is formed over selective ones of the structures, exposing other ones of the structures, e.g., exposing selective sidewall spacers 20. In particular, the mask 28 is formed over the structures, in spaces: 1, 1, 0, 1, 0, 1, 0, 1, 1. Additionally, the mask 26 is formed over the structures, in spaces: 1, 1, 0. It should be understood that the mask 28 does not have to completely cover (e.g., be completely aligned with) the end structures 100, as they are protected by the fill material 24, e.g., $Si_3N_4$. In fact, the mask 28 can be misaligned by 2× widths of the structures, as the fill material 24, e.g., Si3N4, will protect these structures during subsequent etching processes.

An etching process is then performed to remove any exposed (unprotected) sidewall spacer material, e.g., amorphous silicon or other material that is different than the fill material 24, e.g., $Si_3N_4$. In embodiments, the etching process will stop at the etch stop layer, which can be selectively removed by a second etching process. In this way, silicon islands 200 are formed on the BOX 12. The mask 28 can then be removed using conventional oxygen ashing processes, for example.

Figure 7:
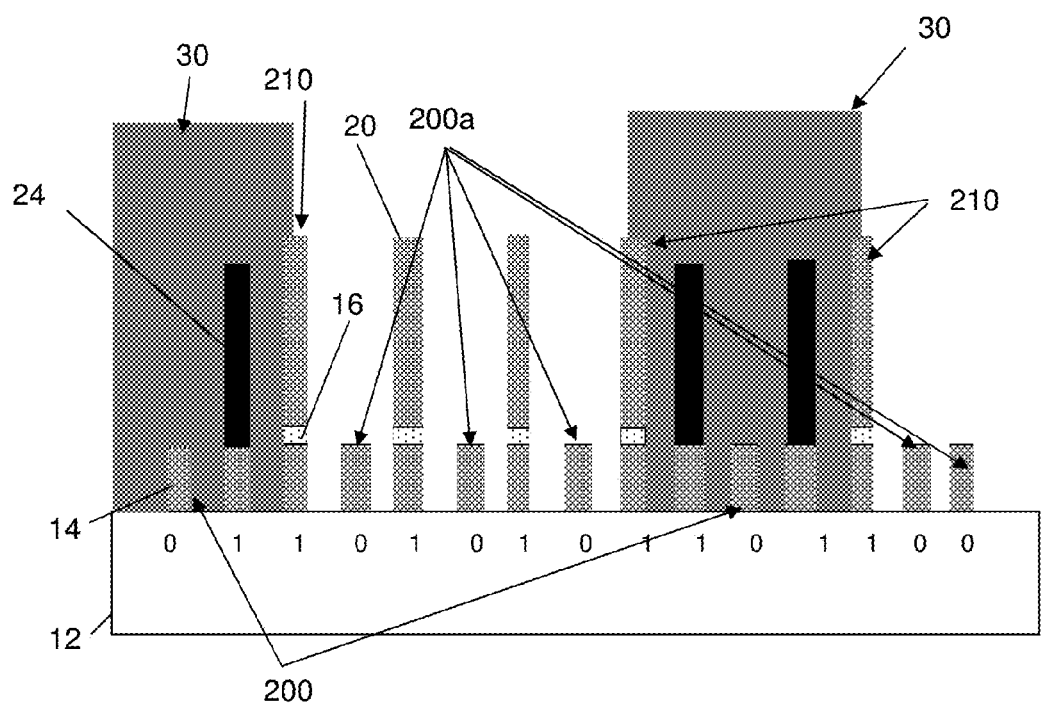

In FIG. 7, another mask 30 is formed over the silicon islands 200, in addition to another grouping of structures. For example, in this embodiment, the mask 30 is formed over the structures in spaces 0, 1, 1. Additionally, the mask 30 is formed over the structures in spaces 1, 1, 0, 1, 1. It should be understood that the mask 30 does not have to completely cover (e.g., be completely aligned with) the end structures 210, which are protected by the sidewall spacers 20. In fact, the mask 30 can be misaligned by 2× widths of the structures 210. An etching process is then performed to remove any exposed fill material 24, e.g., $Si_3N_4$, resulting in silicon islands 200a. The etching process will not affect the sidewall spacers 20, as this etching process is selective to the fill material 24, e.g., $Si_3N_4$. The mask 30 can then be removed using conventional oxygen ashing processes, for example.

Figure 8:
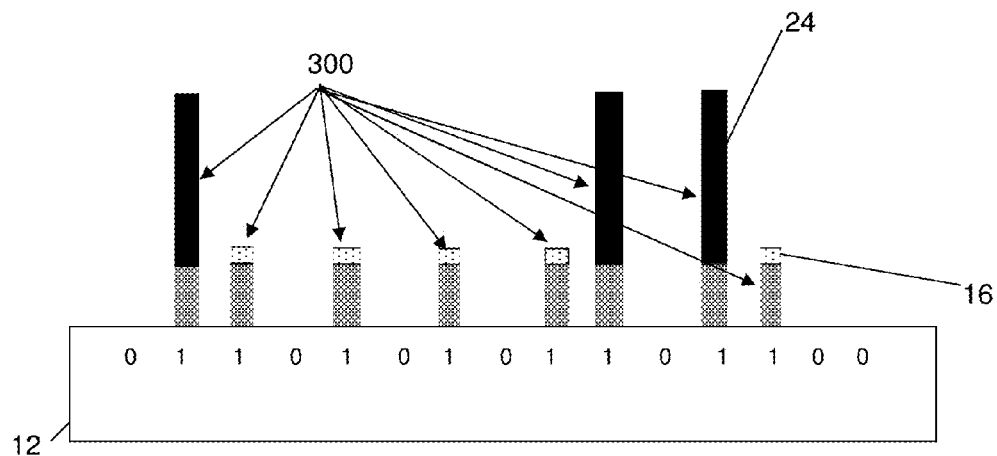

In FIG. 8, any remaining sidewall spacers 20 and the silicon fins (200 and 200a) can be removed, using a selective etch chemistry to the sidewall spacers 20 and the fins (200 and 200a). As the sidewall spacers and the silicon fins are both composed of silicon material, a single etching process selective to both the sidewall spacers and the silicon fins is possible. In this etching process, the fill material 24, e.g., $Si_3N_4$ and the etch stop layer 16 will provide protection to the remaining respective structures 300 (composed of an underlying silicon material). In this way, all structures in the "0" space can be removed.

Figure 9:
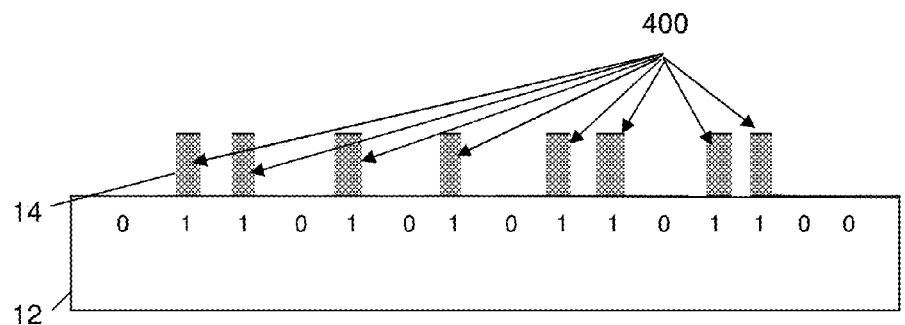

In FIG. 9, the fill material 24, e.g., $Si_3N_4$ and the etch stop layer 16 can be removed through a selective etching process. For example, the fill material 24, e.g., $Si_3N_4$, can be removed with a first etchant chemistry, and the etch stop layer 16 can be removed with a second etchant chemistry. The etching process will leave sub-lithographic features 400, e.g., silicon fins at spaces "1", with a non-constant or substantially constant pitch, while providing improved fin-to-fin width control.

Figure 10:
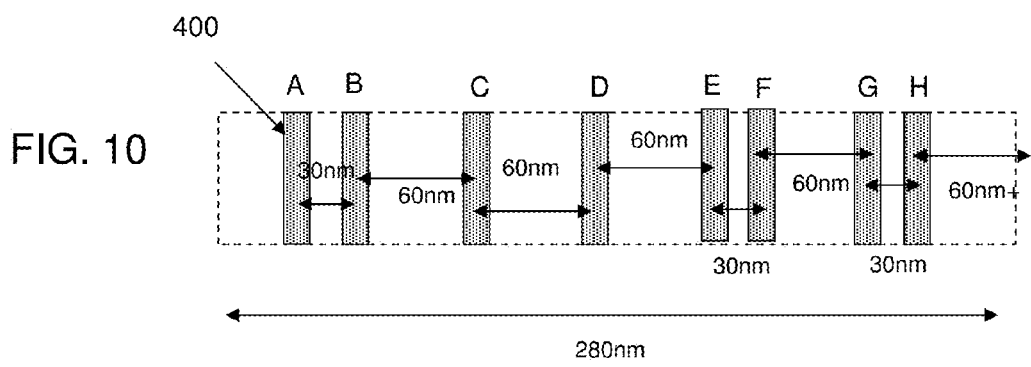
FIG. 10 shows a top view of the structure of FIG. 9, in accordance with aspects of the present invention.

FIG. 10 is a top view of the structure shown in FIG. 9. The fin structures 400 shown herein are sub-lithographic features. As shown in FIG. 10, the fin structure 400 can have a pitch of either approximately 30 nm or 60 nm; although other dimensions are also contemplated by the present invention. For example, the fin structures 400 can have a pitch of approximately 90 nm or 120 nm, in combination with fin structures having a pitch of 30 nm. It should be further understood by those of skill in the art that due to photolithography overlay issues, the dimensions of the first pitch, e.g., 30 nm, the second pitch, e.g., 60 nm, or other pitches may have slight variations. Accordingly, the pitches between fins, as described below, may be equal or substantially equal to one another in view of such overlay issues.

As an illustrative example, starting from the left side of FIG. 10, the first set of fins (labeled "A" and "B") have a first pitch, e.g., 30 nm, and an adjacent fin (labeled "C") to the first set of fins "A" and "B" has a second pitch larger than the first pitch, e.g., 60 nm. The next two fins "D" and "E" are separated by a pitch which is the same or substantially the same dimensions of the second pitch, e.g., 60 nm. The latter fin "E" forms part of another set of fins ("E" and "F") which has a pitch of the same or substantially the same dimensions as the first pitch, e.g., 30 nm. This pair of fins "E" and "F" is adjacent to another pair of fins ("G" and "H"). The pitch of the last pair of fins "G" and "H" is the same or substantially the same as the pitch of the first set of fins "A" and "B", e.g., 30 nm; whereas, a pitch between the fins "F" and "G" are the same or substantially the same to the second pitch, e.g., 60 nm. Following the fin "G", a pitch of more than 60 nm (as two fin structures were removed) may be possible. Such a larger pitch is also possible between any of the fins, using the combination of materials and alternate etching and masking steps as disclosed herein, and which should be understood by those of skill in the art. Advantageously and accordingly, the pitch between the fin structures can be irregular or non-constant by implementing the processes of the present invention.

Accordingly, by implementing the processes of the present invention, a single mask can be employed to define the location of the SIT fins. Fins so-defined will not all have width tolerances of sidewall depositions, and will have "pitch walk" in the original mandrel layer resulting in a non-constant fin width. If so desired, a second mandrel mask can be employed to define a second set of fin mandrels, as shown in FIGS. 11-14.

Figure 11:
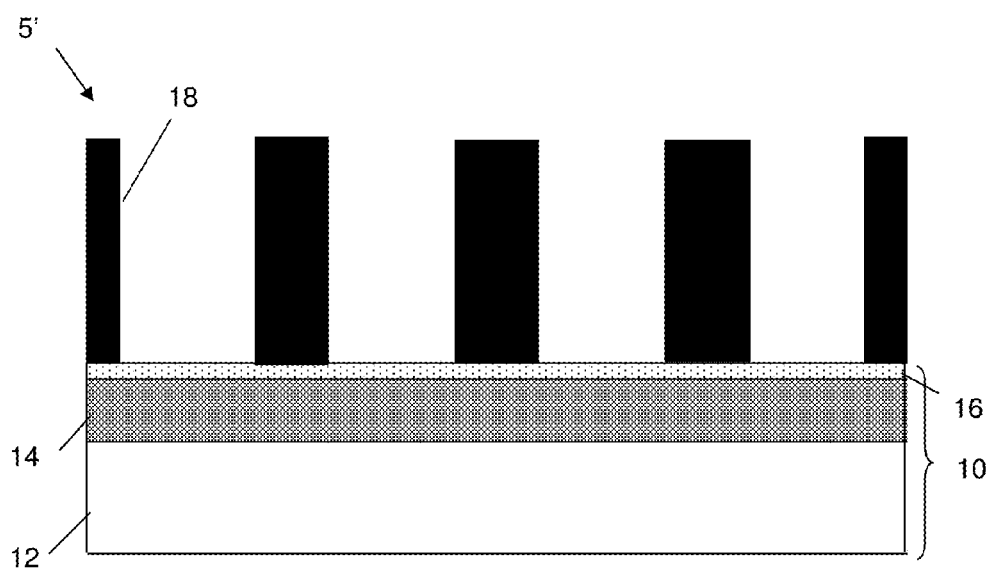
FIGS. 11-15 show processing steps and respective structures in accordance with additional aspects of the present invention.

FIGS. 11-14 show processing steps and respective structures according to additional aspects of the present invention. FIG. 11 shows a structure 5' similar to that shown in FIG. 1. For example, the structure 5' includes a substrate 10 comprising a BOX layer 12 and a silicon based layer 14 formed on the BOX layer 12. An etch stop layer 16 is deposited on the layer 14. A mandrel 18 is formed on the etch stop layer 16, using conventional deposition, lithography and etching processes as discussed above. It should be recognized by those of skill in the art that the etching steps may be, for example, a reactive ion etching (RIE), using different chemistries depending on the materials to be etched.

Figure 12:
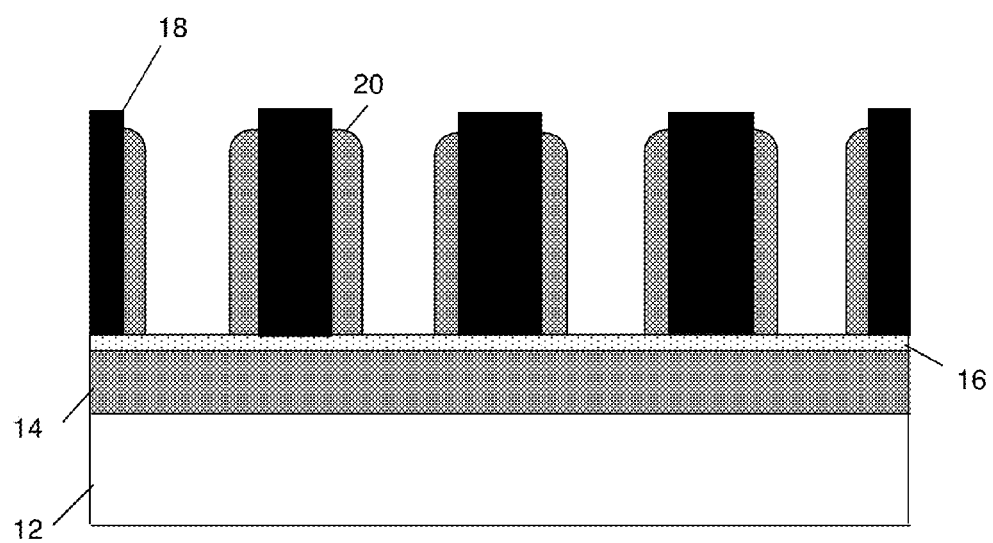

In FIG. 12, sidewall spacers 20 are formed on the sides of the mandrels 18. In embodiments, the sidewall spacers 20 are amorphous silicon (or other material in order to allow selective etching). In embodiments, the sidewall spacers 20 can be formed using conventional deposition processes known to those of skill in the art. The sidewall spacers 20 can have a width of about 6 nm; although, other dimensions are also contemplated by the present invention.

Figure 13:
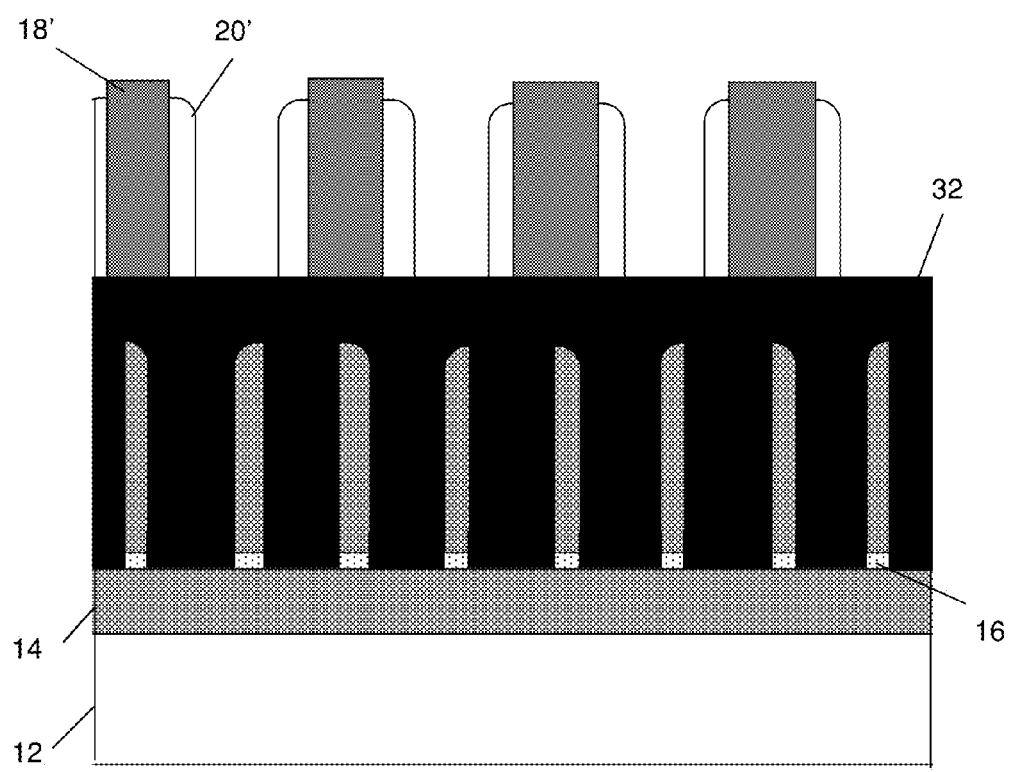

In FIG. 13, the mandrels are removed using a selective etching process, leaving the sidewall spacers 20. A fill material 32, e.g., $Si_3N_4$, is deposited over the sidewall spacers 20. In embodiments, the fill material 32 is planarized using conventional chemical mechanical polishing (CMP) processes. In embodiments, the fill material 32 should remain over the sidewall spacers 20, as a cap. In embodiments, an additional cap layer of fill material can also be deposited and planarized. A second mandrel 18' of amorphous silicon is deposited and patterned on the planarized fill material 32. In embodiments, the second mandrel 18' is aligned with, e.g., formed over, the sidewall spacers 20. Sidewall spacers 20' are then formed on the second mandrel 18', using conventional conformal deposition processes. In embodiments, the sidewall spacers 20' are formed of $SiO_2$ based material.

Figure 14:
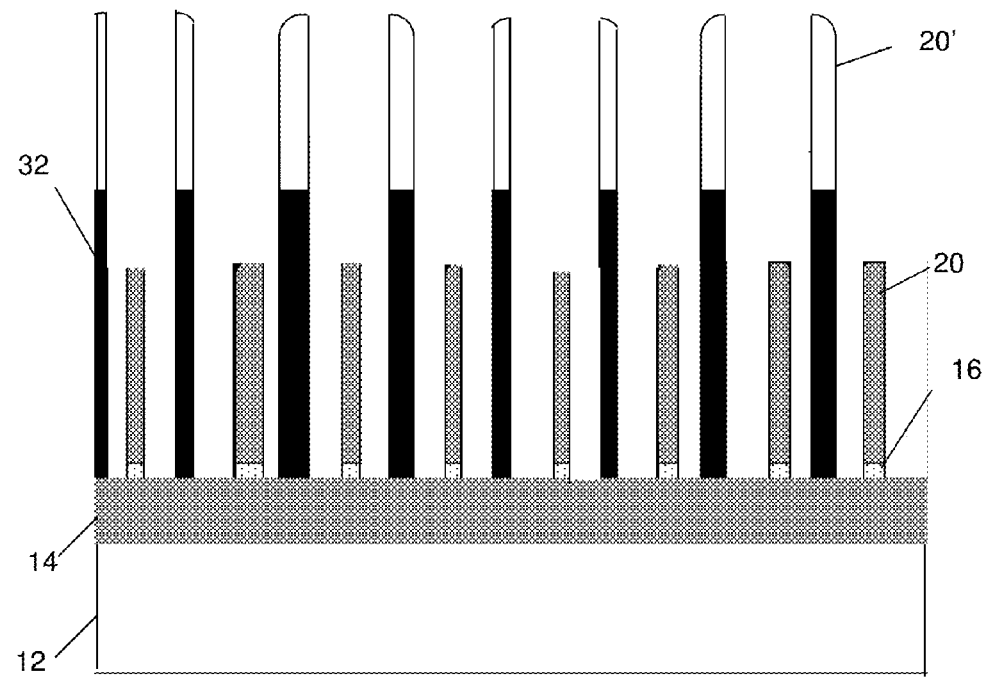

In FIG. 14, the second mandrel 18' and the fill material 32, e.g., $Si_3N_4$, are removed (etched using conventional RIE processes), where the $SiO_2$ based material of the sidewall spacers 20' act as a masking material. In embodiments, the second mandrel 18' and the fill material 32 can be removed using selective etchants.

Figure 15:
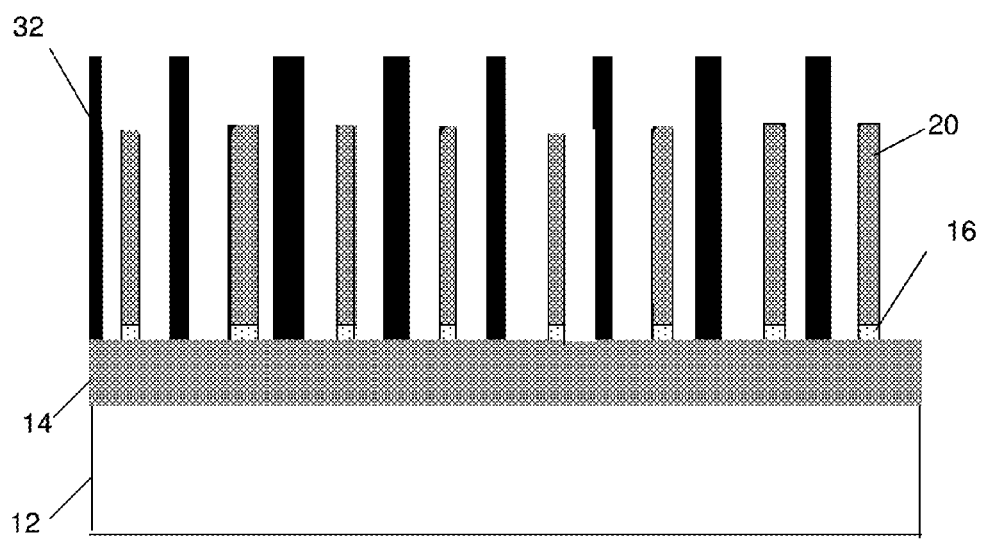

In FIG. 15, the sidewall spacers 20' are removed, using a selective etching process. The process then continues with the processes shown in FIG. 5, for example.

Figure 16:
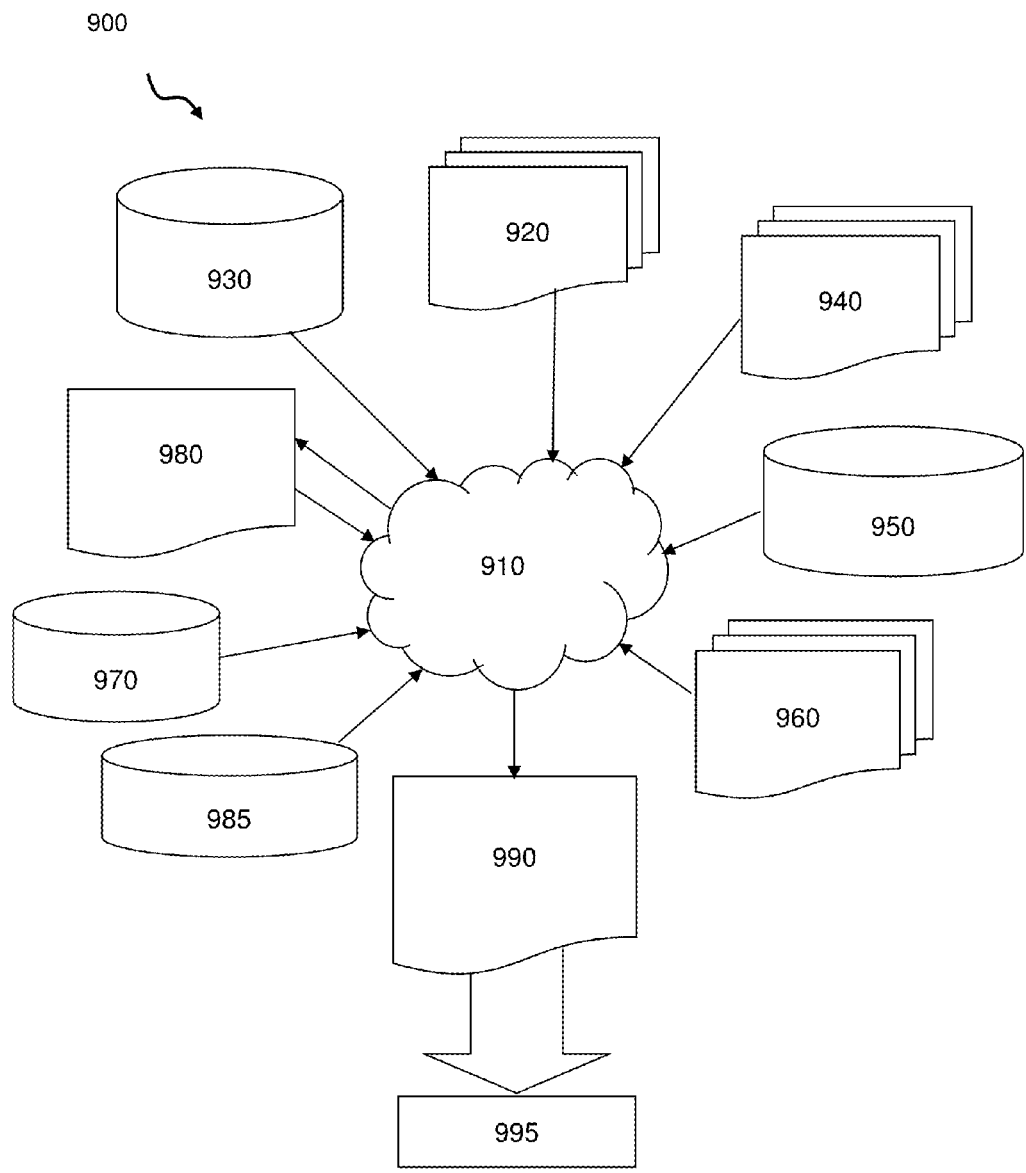
FIG. 16 is a flow diagram of a design process used in semiconductor design, manufacture, and/or test.

FIG. 16 is a flow diagram of a design process used in semiconductor design, manufacture, and/or test. FIG. 16 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-15. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 16 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-15. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-15 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-15. In one embodiment, design structure 990 may comprise a compiled, executable HDL simulation model that functionally simulates the devices shown in FIGS. 1-15.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-15. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
    forming an etch stop layer on a semiconductor material;
    forming a mandrel on the etch stop layer;
    forming sidewall spacer material on the mandrel;
    removing the mandrel;
    forming filler spacers on the sidewall spacer material;
    forming fill material between the filler spacers;
    removing the filler spacers and portions of the semiconductor material below the filler spacers to form:
        a first set of structures comprising the sidewall spacers, the etch stop layer and the semiconductor material, and a second set of structures comprising the fill material and the semiconductor material; and alternately forming a mask over groupings of a plurality of the first set of structures and the second set of structures, and alternating etching material from unprotected ones of the first set of structures and the second set of structures to form fin structures of the semiconductor material with a non-constant pitch.

2. The method of claim 1, wherein the alternately forming the mask and etching comprises:

forming a mask over a first grouping of the plurality of the first set of structures and the second set of structures, with at least one of the first set of structures being unprotected;

removing the sidewall material and the etch stop layer from the at least one unprotected first set of structures to form semiconductor islands;

removing the mask;

forming another mask over another group of the plurality of the first set of structures and the second set of structures and the semiconductor islands, leaving unprotected a grouping of the first set of structures and the second set of structures;

removing the fill material from the unprotected second set of structures;

removing the sidewall spacer material from the unprotected first set of structures;

removing the another mask;

removing the semiconductor islands; and removing any remaining etch stop layer and fill material to form the fin structures of the semiconductor material with a non-constant pitch.

3. The method of claim 2, wherein the fill material and the etch stop layer prevent removal of the semiconductor material of the fins during the removing the semiconductor islands.

4. The method of claim 1, wherein the first set of structures are alternating with the second set of structures.

5. The method of claim 1, wherein the removing the mandrel includes removing the etch stop layer underneath the mandrel.

6. The method of claim 1, wherein the forming the filler spacers and fill material are formed directly on the semiconductor material, where the etch stop layer was removed.

7. The method of claim 1, wherein the fill material is a masking layer of different material than the etch stop layer and the sidewall spacer material such that the alternating etching can be performed selectively.

* * * * *